United States Patent [19]

Konishi et al.

[11] Patent Number: 4,942,441
[45] Date of Patent: Jul. 17, 1990

[54] THIN FILM SEMICONDUCTOR DEVICE AND METHOD OF MANUFACTURING THE SAME

[75] Inventors: Nobutake Konishi; Yoshikazu Hosokawa, both of Hitachiota; Akio Mimura; Takaya Suzuki, both of Katsuta; Jun-ichi Ohwada, Hitachi; Hideaki Kawakami, Mito; Kenji Miyata, Katsuta, all of Japan

[73] Assignee: Hitachi, Ltd., Tokyo, Japan

[21] Appl. No.: 30,623

[22] Filed: Mar. 27, 1987

[30] Foreign Application Priority Data

Mar. 29, 1986 [JP] Japan .................. 61-69818

[51] Int. Cl.⁵ .................................. H01L 29/78
[52] U.S. Cl. ..................... 357/23.7; 357/42; 357/15; 357/4
[58] Field of Search ............ 357/42, 15, 4, 23.7, 357/71 S, 67 S

[56] References Cited

U.S. PATENT DOCUMENTS

| | | | |
|---|---|---|---|
| 4,091,527 | 5/1978 | Goodman | 357/42 |
| 4,206,472 | 6/1980 | Chu et al. | 357/71 S |
| 4,300,152 | 11/1981 | Lepselter | 357/42 |
| 4,736,229 | 4/1988 | Holmberg | 357/4 |

FOREIGN PATENT DOCUMENTS

| | | | |
|---|---|---|---|
| 58-223362 | 12/1983 | Japan | 357/42 |
| 60-74561 | 4/1985 | Japan | 357/42 |
| 60-154661 | 8/1985 | Japan | 357/42 |

OTHER PUBLICATIONS

IBM Technical Disclosure Bulletin, vol. 15, #11, p. 3541, by Anantha et al., Apr. 1973.

*Primary Examiner*—Andrew J. James
*Assistant Examiner*—Mark Prenty
*Attorney, Agent, or Firm*—Antonelli, Terry, Stout & Kraus

[57] ABSTRACT

Complementary thin film transistors (C-TFT) formed on an insulating substrate, comprising a pair of highly resistive n-type silicon islands, a pair of heavily doped n-type regions formed in one of the islands to form source and drain regions of n-channel TFT, a pair of contacts formed on the surface of the other island and establishing a high potential barrier when the underlying region is of n-type and a low potential barrier when the underlying region is inverted to be of p-type. The process for manufacturing complementary TFTs can be simplified significantly.

13 Claims, 7 Drawing Sheets

THIN FILM SEMICONDUCTOR DEVICE AND METHOD OF MANUFACTURING THE SAME

BACKGROUND OF THE INVENTION

1. FIELD OF THE INVENTION

The present invention relates to a semiconductor device and a method of manufacturing the same, and more particularly, a thin film semiconductor device formed on an insulating substrate and a method of manufacturing the same.

2. DESCRIPTION OF THE RELATED ART

Semiconductor devices such as transistors can be formed on an insulating substrate such as a glass plate or a silicon substrate coated with a passivation layer. It is not possible to apply epitaxial growth onto the insulating substrate in a usual manner. Thus, a thin film semiconductor layer of polycrystalline or amorphous state is first formed on the insulating substrate and a semiconductor device is then formed on the thin film semiconductor layer.

For example, a matrix of cells together with active elements such as transistors are formed on a transparent substrate, thereby forming an active matrix. In the field of liquid crystal displays, a high attention is directed to an active matrix liquid crystal display panel in which a matrix of transparent electrodes for exciting a liquid crystal material and thin film transistors (TFTs) serving as switching elements are formed on a glass substrate. Such a TFT can be made in the form of either a p-channel insulated gate (IG) or an n-channel IGTFT. In the case of making the n-channel IGTFT, $n^+$-type source/drain regions are formed by doping a thin film of highly resistive i-type or p-type silicon (of polycrystalline or amorphous state) with an n-type impurity, and source/drain electrodes are disposed on the $n^+$-type source/drain regions in contact therewith. In the case of making the p-channel IGTFT, $p^+$-type source/drain regions are formed in a thin film of i-type or n-type silicon with a p-type impurity, and source/drain electrodes are disposed on the $p^+$-type source/drain regions in contact therewith.

Lepselter and Sze have proposed an IGTFT using Schottky barrier contacts for a source and a drain (see Proceedings of the IEEE, Proceedings Letters, Aug. 1968, pp. 1400-1402). In the proposed IGFET, source and drain electrodes made of platinum silicide PtSi are brought in contact with a $<100>$ oriented n-type silicon substrate having a resistivity of 1 $\Omega$·cm. When a negative voltage is applied to a gate electrode, a channel inverted to be of p-type is produced between the source electrode and the drain electrode. In the case where the electrodes of PtSi are disposed on the n-type silicon substrate, the barrier height of 0.85 V is established. But, in the case of electrodes of PtSi disposed on a p-type silicon substrate, the barrier height is 0.25 V so that a drain current flows.

Taking account of the fact that when the source and drain regions are formed with Schottky junctions, a short-channel effect can be improved but a restriction is imposed on an ability of current supply from the source region, Mizutani has proposed an MOSFET having a source region formed through impurity diffusion and a drain region formed with a Schottky junction (see JP-A-58-182871).

For driving the liquid crystal display (LCD) panel, there are required various peripheral circuits including a shift register, a matrix circuit, an inverter circuit, etc. If it is possible to incorporate these peripheral circuits into the LCD panel, the number of parts required can be reduced, thereby allowing improved reliability and greatly lowered cost.

When it is desired to make a limitation of power consumption, complementary insulated gate thin film transistors (C-IGTFTs) must be used for a part of such peripheral circuits. Namely, it is necessary to simultaneously fabricate a p-channel IGTFT and an n-channel IGTFT. The fabrication of C-IGTFTs requires both doping with an n-type impurity and doping with a p-type impurity. This increases the number of process steps for manufacture of the device, which provides a great factor of increasing the cost. For example, in spite of the fact that switching elements necessary for ah active matrix type of LCD panel can be formed by only either p-channel IGTFTs or n-channel IGTFTs, the requirements for incorporation of the peripheral circuits into the panel necessitate the use of both p-channel IGTFTs and n-channel IGTFTs and hence the doping with both p- and n-type impurities, thereby resulting in remarkable increase of the number of photomasks to be used and of the number of process steps to be carried out.

SUMMARY OF THE INVENTION

An object of the present invention is to provide a semiconductor device having complementary insulated gate thin film transistors (C-IGTFTs) the fabrication of which is facilitated, and a method of manufacturing the same device.

In manufacturing semiconductor devices, the number of process steps, especially, the number of steps using masks is important from aspects of cost, yield, etc. In order to manufacture circuits including C-IGTFTs with the minimum number of process steps, the present invention eliminates a need of carrying out doping with respective individual impurities for fabrication of p-channel and n-channel IGTFTs. This is achieved by forming source and drain regions of the p-channel TFT by means of Schottky contacts.

The source and drain regions of the n-channel IGTFT of the C-IGTFTs are constructed by n-type impurity doped regions, and electrodes are disposed on the impurity doped source and drain regions, in contact therewith, respectively. On the other hand, the source and drain regions of the p-channel IGTFT are formed by Schottky contacts. The breakdown voltage of the n-channel IGTFT is carried by the pn (in) junction while the breakdown voltage of the p-channel IGTFT is born by the Schottky contact.

For the TFTs, a semiconductor (e.g. silicon) of polycrystalline or amorphous state can be made highly resistive. The same thin film of semiconductor may be used for forming channel regions of the p-channel and n-channel IGTFTs.

The formation of contact layers to the source and drain regions of the n-channel IGTFT and the formation of the source and drain regions of the p-channel IGTFT can be carried out simultaneously.

DESCRIPTION OF THE PREFERRED EMBODIMENTS

Figure 1A:
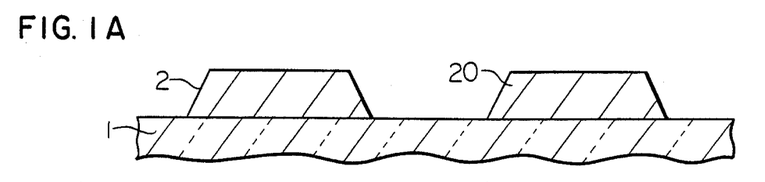
FIGS. 1A to 1I show an embodiment of the present invention, FIGS. 1A to 1H being cross-sectional views for illustrating successive steps for manufacturing C-IGTFTs according to this embodiment and FIG. 1I being a schematic top view of the device shown in FIG. 1H.
Figure 1B:
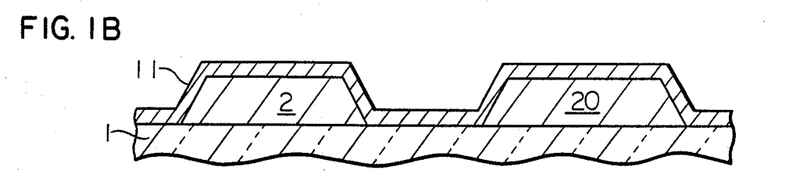
Figure 1C:
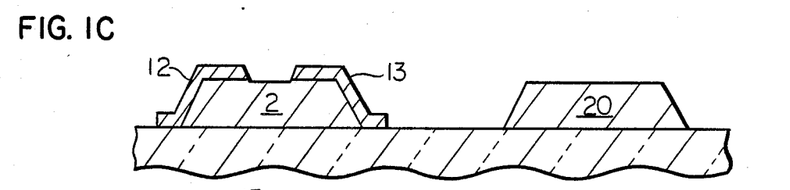
Figure 1D:
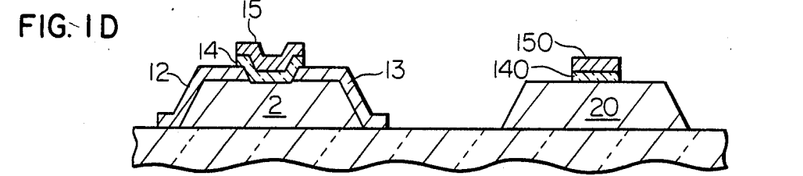
Figure 1E:
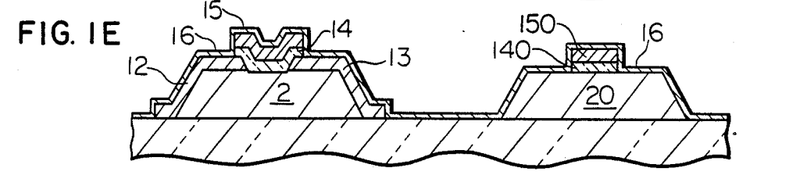
Figure 1F:
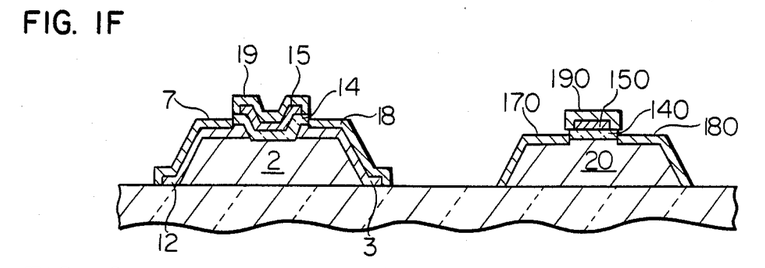
Figure 1G:
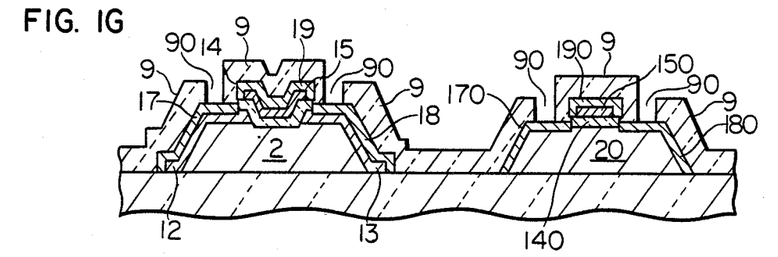
Figure 1H:
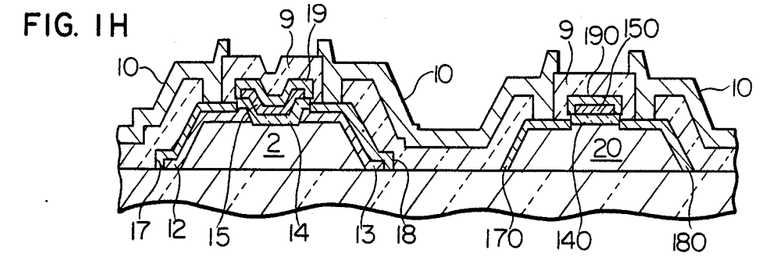
Figure 1I:
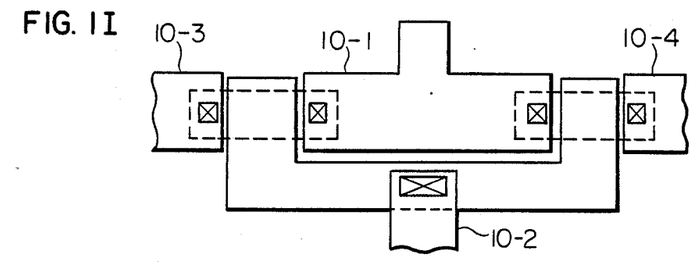

FIGS. 1A to 1H are cross sections showing successive steps for manufacturing complementary insulated gate thin film transistors (C-IGTFTs) according to an embodiment of the present invention and FIG. 1I is a schematic top view of the C-IGTFTs shown in FIG. 1H. For the Schottky TFT, reference is made to copending application Ser. No. 848,474 filed on Apr. 7, 1986, which is hereby incorporated by reference.

Referring to FIG. 1A, a layer of polycrystalline silicon (poly-Si) of i-type or $n^-$-type is deposited with a thickness of, for example, about 0.1 μm on a glass substrate 1 through low pressure chemical vapor deposition (LPCVD) under a pressure of about 100 Pa. The pressure can be suitably selected from the range of about 10 to 1000 Pa. Vacuum evaporation, plasma CVD or molecular beam deposition may be used in place of the LPCVD. In usual, the thickness of the layer deposited can be selected from the range of about 0.01 to 2 μm, taking the resistivity into account. Instead of polycrystalline silicon may be used μ(micro)-crystalline silicon or amorphous silicon (a-Si). The plasma CVD is suitable for depositing an amorphous silicon layer. In place of the glass subsrate can be used an insulating substrate which may be another transparent substrate such as fused quartz, passivated semiconductor substrate, or the like.

A film of photoresist material is formed on the deposited polycrystalline silicon layer and patterned by exposure and development. Using the patterned photoresist film as a mask, the underlying polycrystalline silicon layer is patterned by means of dry etching to form polycrystalline silicon regions 2 and 20. FIG. 1A shows a state after the photoresist pattern has been removed.

Next, a layer 11 of $n^+$-type amorphous or polycrystalline silicon is deposited on the entire surface, as is shown in FIG. 1B. This silicon layer 11 is to serve as source and drain regions of an n-channel IGTFT and has a thickness enough not to be completely consumed at a subsequent silicifying step for forming the silicide film.

Thereafter, by using a photoresist film pattern, the $n^+$-layer 11 is removed, leaving only those portions thereof which serve as the drain and source regions 12 and 13 of the n-channel IGTFT, as is shown in FIG. 1C. In this manner, an island for the n-channel IGTFT with the $n^+$-source/drain regions and an island for a p-channel IGTFT are prepared.

A layer of silicon oxide which is to serve as an insulating gate film, is then formed. This silicon oxide layer may be deposited on the entire surface by means of atmosphere pressure CVD (APCVD), plasma CVD, etc. or formed in the exposed silicon surface through thermal oxidation at a low temperature of, for example, about 600° C. in an wet atmosphere. The thickness of the insulating gate film may be a suitable value selected from the range of, for example, 100 to 2000 Å. After the formation of the insulating gate film, a film of heavily doped polycrystalline or amorphous silicon which is to serve as gate electrodes, is deposited with a thickness of, for example, about 500 Å. A photoresist film is formed on the double-film layer including the insulating gate film and the gate electrode film and is then patterned. By using the patterned photoresist film as a mask, the double-film layer is dry-etched off, leaving only the portions thereof serving as gate regions of the n-channel IGTFT and p-channel IGTFT so as to form insulating gate films 14 and 140 of and gate electrodes 15 and 150 of the n-channel and p-channel IGTFTs. This state is shown in FIG. 1D.

A layer 16 of platinum (Pt) is formed with a thickness of about 500 Å on the entire surface by means of sputtering and is then subjected to a thermal treatment at temperatures of 450° to 550° C. (see FIG. 1E). An atmosphere used for the thermal treatment may be either an inert atmosphere containing an inert gas such as Ar, an oxidative atmosphere containing a gas such as $O_2$, or a reductive atmosphere containing a gas such as $H_2$. In the case where the silicide layer may be $Pt_2Si$, a thermal treatment at the temperature of about 400° C. can be employed. When the silicifying process for forming the silicide film is also utilized for activating the impurities, the use of temperatures of 500° to 550° C. is preferable.

Non-silicified portions of the Pt layer 16 are removed to obtain silicide layers 17, 18, 19, 170, 180 and 190 as shown in FIG. 1F. Returning to FIG. 1D, the portions of the structure excepting the side faces of the insulating gate films 14 and 140 are amorphous silicon or polycrystalline silicon. As a result of the silicifying process of forming silicide, therefore, the silicide layers shown in FIG. 1F are produced at all the portions where the Pt layer 16 shown in FIG. 1E is adjacent to silicon. The silicide layers 17 and 18 on the source and drain of the n-channel IGTFT adjoin the heavily doped $n^+$-type drain and source regions 12 and 13, making ohmic contacts therewith. The silicide layers 19 and 190 on the gate electrode films 15 and 150 of heavily doped polycrystalline or amorphous silicon are in ohmic contact with the gate electrode films 15 and 150. For the p-channel IGTFT, the drain and source silicide layers 170 and 180 are produced on the island of i-type or $n^-$-type, forming Schottky junctions having the barrier height of about 0.85 V.

The metal for forming the Schottky barrier may be selected from the group consisting of Ti, Ta, Cr, Mo, Pd, Pt, W, their mixtures and their silicides. Silicides of Pt, Mo and W are preferable from the points of barrier height and the low temperature for silicifying process of forming silicide.

In the n-channel IGTFT, a current path between the source and drain is formed by $n+-i(n^-)-n^+$. The i-type or n⁻-type channel region 2 is highly resistive so that a large current does not flow unless something is done. When a positive bias voltage is applied to the drain region 12, the channel-drain junction is reverse biased so that a depletion layer extends into the channel region 2.

Figure 3A:
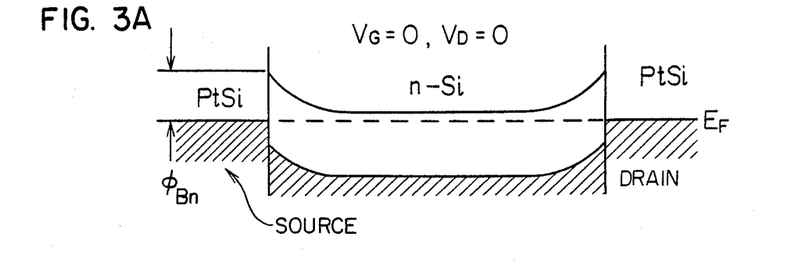
FIGS. 3A to 3C are diagrams for explaining the operation of the p-channel IGTFT in the embodiment shown in FIGS. 1A to 1I.
Figures 3B, 3C:
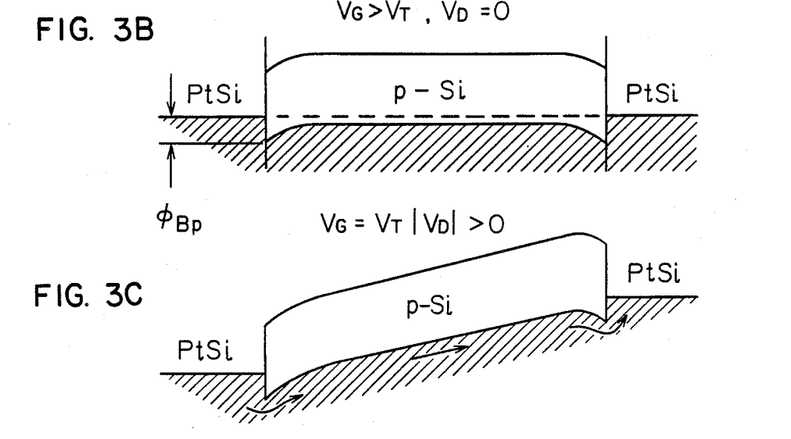

An operation presumed for the p-channel IGTFT will now be explained referring to FIGS. 3A to 3C. When a gate bias $V_G$ is positive or zero, the channel is of n-type and the silicide forms a Schottky diode (see FIG. 3A). As the magnitude $V_G$ of the gate bias $-V_G$ having a negative polarity increases to be beyond a threshold value $V_T$, a p-type channel is induced (see FIG. 3B). When the channel region inverted to be of p-type becomes adjacent to the silicides of the source and drain, a current path formed by PtSi on p-type silicon is connected in parallel with the Schottky diode formed by the silicide on n-type silicon. The height of a barrier produced by PtSi on the p-type silicon is in order of 0.25 V at largest and hence is remarkably small in comparison with the barrier height produced by PtSi on the n-type silicon. The application of a drain bias in such a state causes a current to flow through the p-channel IGTFT (see FIG. 3C). If the absolute value of the gate bias voltage is decreased, the layer inverted to be of p-type disappears, resulting in the Schottky diode on the n-type silicon (see FIG. 3A). At this state, no drain current flows even if any drain voltage is applied.

A semiconductor device is completed by providing electrodes to the structure of FIG. 1F and performing passivation.

More especially, as is shown in FIG. 1G, a phosphosilicate glass (PSG) layer 9 is deposited on the whole surface of the structure of FIG. 1F and throughholes 90 for contacts to wiring patterns are thereafter provided in the PSG layer 9. Then, as is shown in FIG. 1H, a wiring metal material (e.g. Al-Si alloy) is sputtered and photolithographically patterned to form wiring patterns 10.

FIG. 1I shows a top view of the semiconductor device of FIG. 1H. It is seen from FIG. 1I that the source of the n-channel IGTFT and the source of the p-channel IGTFT are connected with each other by a wiring pattern 10-1 and an input signal is applied to the gate of those IGTFTs through a wiring pattern 10-2. The drain of the n-channel IGTFT is connected to a positive voltage line through a wiring pattern 10-3 while the drain of the p-channel IGTFT is connected to a negative voltage line through a wiring pattern 10-4.

Figure 2A:
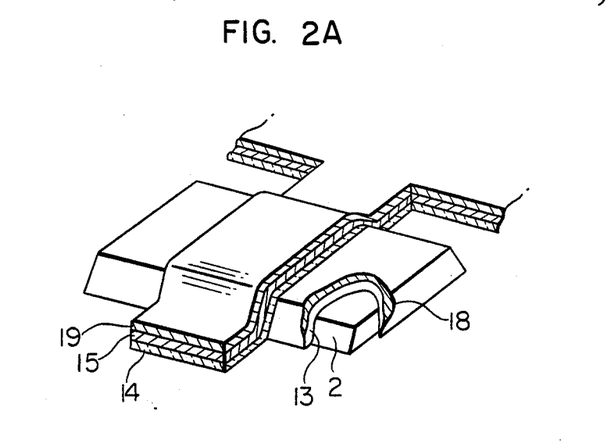
FIGS. 2A and 2B are partly broken perspective views of two (n-channel and p-channel) IGTFTs appearing in the embodiment shown in FIGS. 1A to 1I.
Figure 2B:
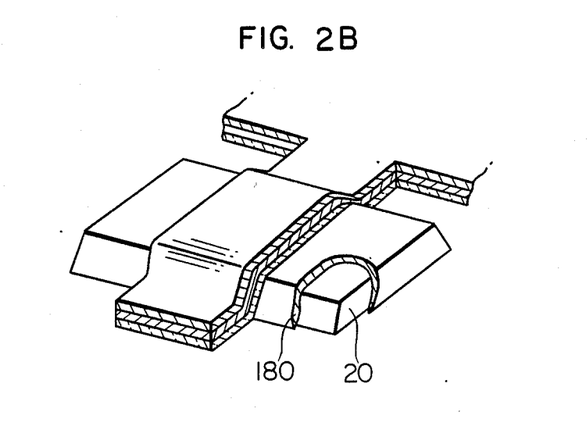

FIG. 2A is a partly broken perspective view of the n-channel IGTFT shown in FIG. 1F and FIG. 2B is a partly broken perspective view of the p-channel IGTFT shown in FIG. 1F.

With the above-described fabrication steps, an inverter circuit constructed by C-IGTFTs is produced. As is apparent from the foregoing description, the number of photomasks required is 5 (five).

Figure 4:
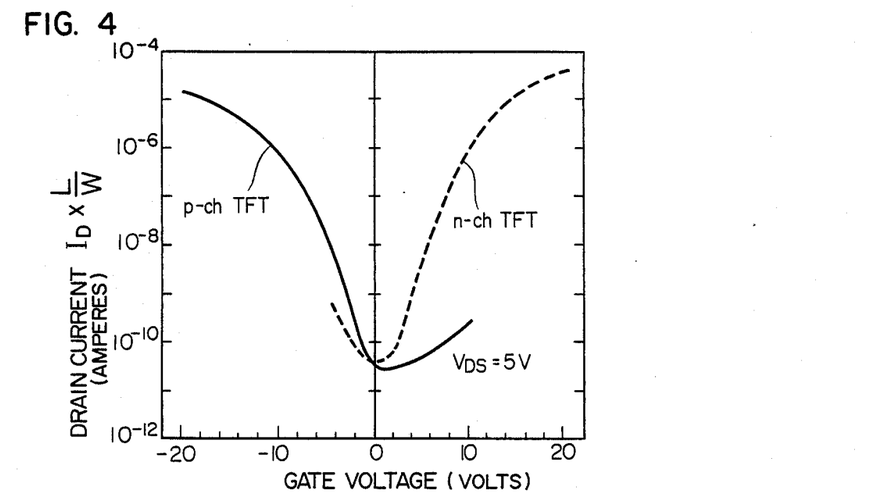
FIG. 4 is a graph showing the drain current $I_D$ versus gate voltage $V_G$ characteristics of the n-channel and p-channel IGTFTs as constituent elements of the C-IGTFTs according to the embodiment shown in FIGS. 1A to 1I.

FIG. 4 shows the drain current $I_D$ in amperes versus gate voltage $V_G$ (in volts) characteristic of each of the n-channel IGTFT and p-channel IGTFT constituting the C-IGTFTs shown in FIG. 1, when a voltage $V_{DS}$ between the source and the drain is 5 V. The channel was made of non-doped polycrystalline silicon with a thickness of 5000 Å, a channel length of 50 μm (for n-channel) and 20 μm (for p-channel) and a channel width of 10 μm. The drain current is normalized by multiplying the ratio L (channel length)/W (channel width) to the raw drain current. The source and drain regions of the n-channel IGTFT were doped with n-type impurity at the concentration not lower than $10^{20}/cm^3$ and were thermally treated at temperatures not higher than 600° C. The Pt layer was treated in an oxygen atmosphere at 475° C. In FIG. 4, a solid curve illustrates the characteristic for the p-channel IGTFT and the dotted curve illustrates the characteristic for the n-channel IGTFT. Operating ranges intended for the n-channel and p-channel IGTFTs are positive and negative gate voltage areas, respectively. It is apparent from FIG. 4 that according to the present embodiment, the ratio of $I_D$ at $V_G=\pm 20$ V to $I_D$ at $V_G=0$, i.e. a so-called on/off current ratio is not less than five figures in each case of the n-channel and p-channel IGTFTs. These characteristics are satisfactory, for example, when the C-IGTFTs are used as an active matrix of TFTs for a liquid crystal display.

Another embodiment according to the present invention will now be explained referring to FIG. 5.

Though the embodiment described in conjunction with FIG. 1 has been applied to TFTs of so-called coplanar-electrode structure, the present embodiment of FIG. 5 is applied to TFTs of so-called staggeredelectrode structure.

Figure 5A:
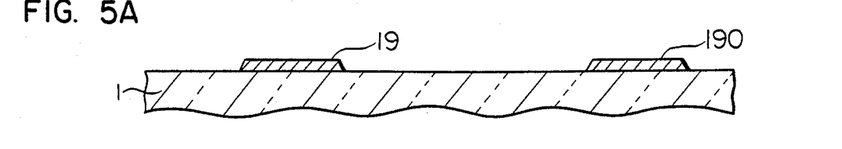
FIGS. 5A to 5I are cross-sectional views for illustrating successive steps for manufacturing a semiconductor device according to another embodiment of the present invention.

First, Cr is evaporated or sputtered onto the whole surface of a glass substrate 1 and thereafter the Cr layer is photolithographically etched to form a pair of gate electrode patterns 19 and 190, as is shown in FIG. 5A. Mo, Cr-Mo alloy, etc. may be used instead of Cr as a metal which has a good adhesiveness to glass. In case when the following process temperature is so high that there is a problem arising from the reaction of the metal with the glass, polycrystalline silicon doped with impurity to thereby reduce the resistivity may be used as the gate electrode. In the same way as the embodiment described in conjunction with FIGS. 1A to 1H, a transparent insulator substrate other than the glass substrate, a semiconductor substrate subjected to passivation may be used.

Figure 5B:
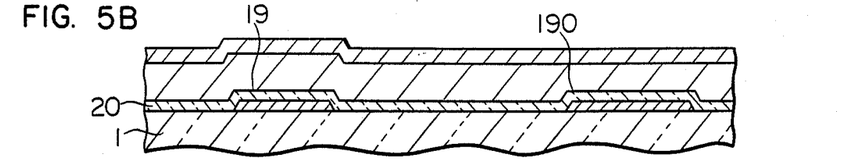

As is shown in FIG. 5B, on the entire surface are an insulating gate film 20 made of $SiN_x$, an i-type or n⁻-type layer of polycrystalline, and an n⁺-type layer of amorphous, μ-crystalline or polycrystalline silicon, in the mentioned order. The layer serving as a channel may be made of μ-crystalline of amorphous silicon instead of polycrystalline silicon. Those silicon layers can be formed in similar manners to the embodiment shown in FIGS. 1A to 1H. The insulating gate film 20 may be made by a film of $SiO_2$ or a composite film of $SiN_x/SiO_2$ in place of the $SiN_x$ film.

Figure 5C:
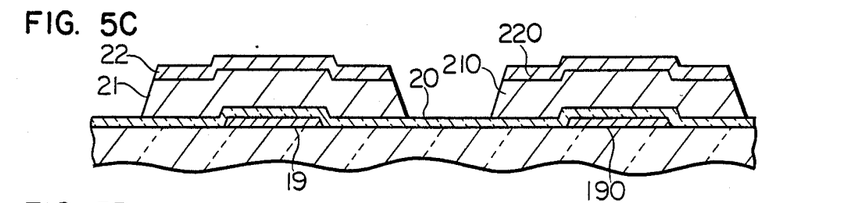

Next, the resulting structure is etched like islands by use of a photoresist film, thereby forming n⁻-type polycrystalline silicon layers 21 and 210 and n⁺-type polycrystalline silicon layers 22 and 220, as is shown in FIG. 5C. An n-channel IGTFT and a p-channel IGTFT are to be formed at an island including the layers 21 and 22 and an island including the layers 210 and 220, respectively.

Figure 5D:
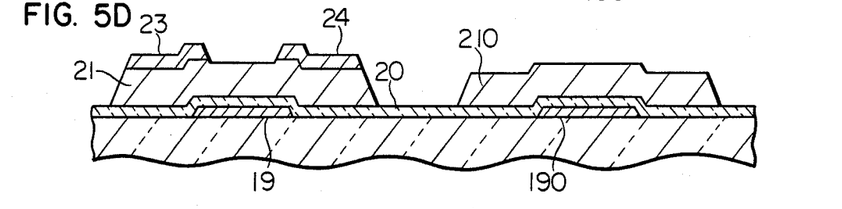

As is shown in FIG. 5D, the portions of the n⁺-layers 22 and 220 excepting drain and source portions 23 and 24 of the n-channel IGTFT are removed by using a photoresist film.

Figure 5E:
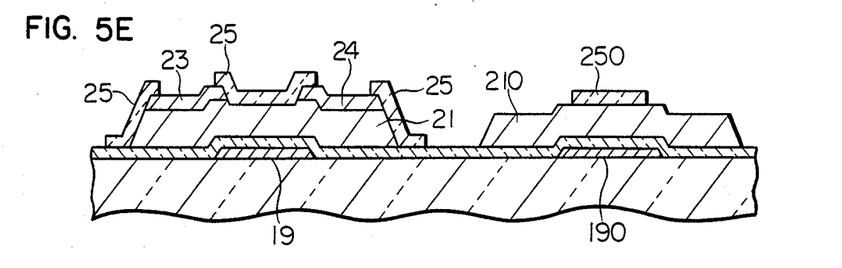

Then, an insulating layer made of $SiO_2$ or the like is deposited on the entire surface The portions of the $SiO_2$ layer on the source and drain regions are selectively removed, leaving the insulating layer portions 5 and 250 (see FIG. 5E). In the n-channel IGTFT, the $SiO_2$ layer 25 is also formed on the side surface of the n⁻-polycrystalline silicon layer 21.

Figure 5F:
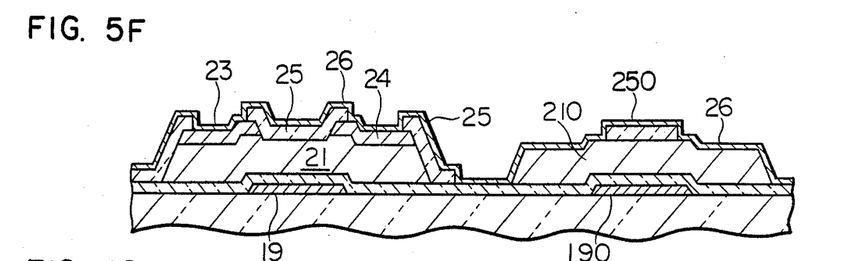

FIG. 5F shows a state after a layer 26 of Pt has been deposited with a thickness of about 500 Å on the whole surface by sputtering.

Figure 5G:
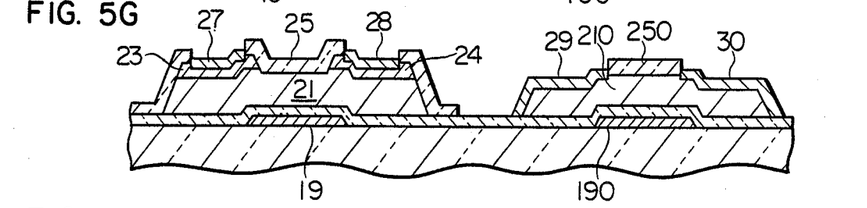

The resulting structure is subjected to a thermal treatment at 450° to 550° C. to allow reaction of platinum (Pt) with silicon (Si), thereby producing platinum silicide (PtSi). By removing those portions of the Pt layer which have not reacted, a structure shown in FIG. 5G is obtained. The silicide regions 27 and 28 constitute drain and source contacts of the n-channel IGTFT while the silicide regions 29 and 30 constitute source and drain regions of the p-channel IGTFT.

Figure 5H:
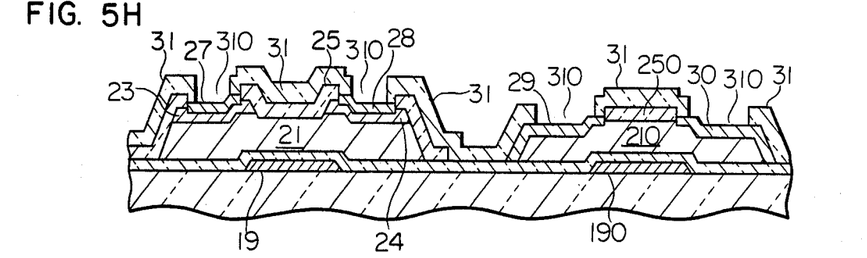

At the next step, a PSG layer 31 is deposited on the whole surface and through-holes 310 are formed for wiring to the contact portions, as is shown in FIG. 5H. Contacts for gate electrodes are not shown.

Figure 5I:
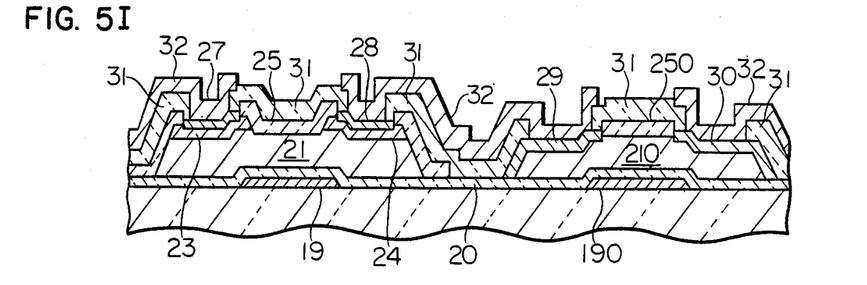
Figure 6:
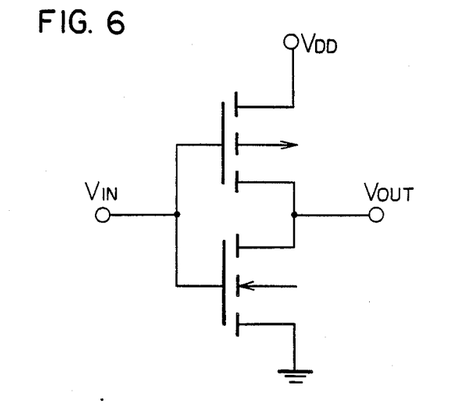
FIG. 6 shows an equivalent circuit of the semiconductor device obtained by the embodiment shown in FIGS. 5A to 5I.

A wiring metal 32 such as Al-Si is deposited by sputtering and is then patterned, as is shown in FIG. 5I. The n-channel IGTFT and the p-channel IGTFT constitute such a C-IGTFT inverter circuit as shown in FIG. 6, like the circuit shown in FIGS. 1H and 1I.

Also in the present embodiment shown in FIG. 5, the drain and source electrodes 27 and 28 of the n-channel IGTFT are in ohmic contact with the n⁺-type layers 23 and 24 while the drain and source of 29 and 30 of the p-channel IGTFT form Schottky junctions with respect to the i-type or n⁻-type layer 210.

According to the embodiment of FIG. 5, a structure in the vicinity of the drain and the source is similar to the embodiment of FIG. 1 but the insulating gate film 20, the i-type polycrystalline silicon layer 21 and the n⁺-type layer 22 can be continuously formed, which is a merit of the staggered-electrode structure. The crystal interfaces between the insulating gate film 20 and the polycrystalline silicon layers 21, 210 influencing the turn-on characteristic of the TFT and the junctions between the polycrystalline silicon layer 21 and the amorphous or polycrystalline silicon layers 23, 24 influencing the turn-off characteristic thereof can be made good.

The silicide layers used for wiring in the foregoing embodiments have excellent resistance against chemicals in comparison with wiring layers of metal such as Al or Cr. Therefore, the yield at the subsequent steps of fabrication process can be improved. When used for an active matrix type of liquid-crystal display (LCD) panel, high reliability can be expected.

In the disclosed embodiments, platinum silicide PtSi has been used. However, Al, Au, Cr, Mo, Pd, Pt, W, their cilicides, or the mixtures thereof may be used. Preferably, a material is selected which makes a good ohmic contact with the n⁺-type layer on one hand and a good Schottky junction with the i-type or n⁻-type layer on the other hand.

According to the foregoing embodiments, the formation of contacts for the drain and source of the n-channel IGTFT and the formation of the drain and source regions for the p-channel IGTFT can be simultaneously carried out, thereby allowing the manufacture of C-IGTFTs through a simplified process.

Figure 7:
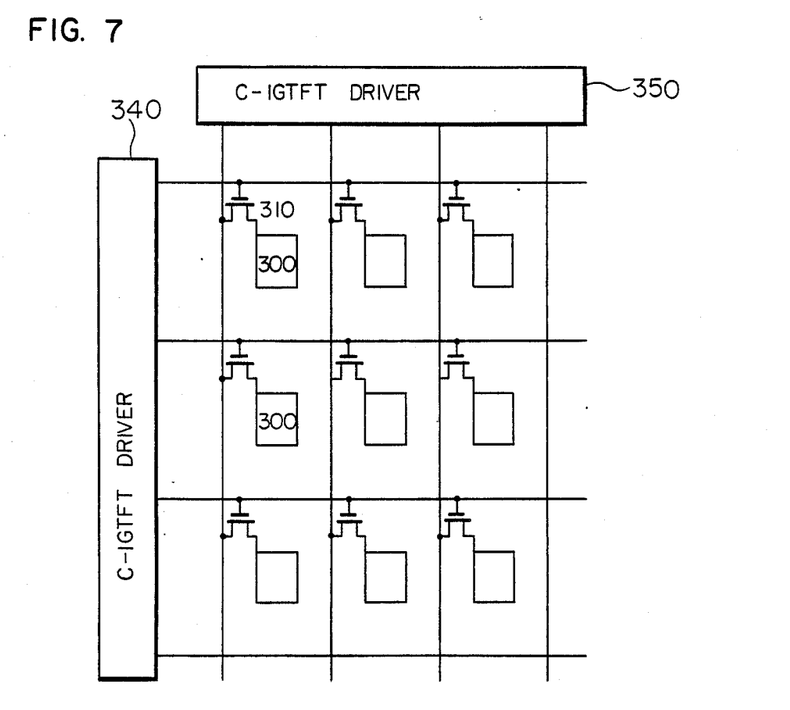
FIG. 7 is a circuit diagram schematically showing an example of an active matrix type of liquid crystal display.

FIG. 7 schematically shows an example of an active matrix type of LCD. The matrix is formed by cells 30 carrying transparent electrodes. Each switch 310 formed of a TFT is connected to each cell 300. Complementary driver circuits 340 and 350 are formed in the periphery of the cell matrix by means of the C-IGTFTs disclosed herein. The overall circuitry is formed on a glass substrate.

We claim:

1. A complementary thin film semiconductor device comprising:
    an insulating underlie for supporting the semiconductor device to be formed thereon;
    a pair of thin film semiconductor island regions supported on said insulating underlie, spaced from each other and having a high resistivity and a conductivity type of i- or n-type;
    a pair of heavily doped n-type regions formed on one of said island regions and spaced from each other by a predetermined distance, the heavily doped regions constituting a source and a drain region of an n-channel thin film transistor (n-TFT) and the predetermined distance defining a channel length of the n-TFT;
    a first pair of metal contacts formed on a surface of the other of said island regions and spaced from each other by another predetermined distance, the metal contact forming a high potential barrier when the underlying semiconductor region is of n-type and a reduced potential barrier when the underlying region is of p-type, the pair of metal contacts constituting a source and a drain region of a p-channel thin film transistor (p-TFT) and said another predetermined distance defining a channel length of the p-TFT;
    a pair of insulated gate structures formed on said pair of island regions, each at a position between the source and the drain of the associated TFT; and
    a second pair of metal contacts formed on said pair of heavily doped n-type regions not to contact directly with said island region, wherein the insulated gate structure of the n-channel thin film transistor is formed to overlap predetermined portions of said source region and said drain region of the n-channel thin film transistor.

2. A complementary thin film semiconductor device according to claim 1, wherein said semiconductor is silicon of polycrystalline, micro-crystalline or amorphous state, and said metal contact is formed of one selected from the group consisting of Ti, Ta, Cr, Mo, Pd, Pt, W, their silicides and the mixtures thereof.

3. A complementary thin film semiconductor device according to claim 1, wherein said insulated gate structure and said source and drain regions are all disposed on a same side of the island region.

4. A complementary thin film semiconductor device according to claim 1, wherein said insulated gate structure is disposed between said insulating underlie and said island region, and said source and drain regions are disposed on the other side of the island region.

5. A complementary thin film semiconductor device according to claim 1, further comprising a conductive wiring pattern connecting the source regions of n-TFT and p-TFT.

6. A complementary thin film semiconductor device according to claim 5, further comprising another conductive wiring pattern connecting an input signal line with said insulated gate structures, thereby forming a complementary TFT inverter.

7. A complementary thin film semiconductor device according to claim 1, wherein said insulating underlie is a transparent substrate carrying transparent electrodes.

8. A complementary thin film semiconductor device according to claim 7, further comprising a liquid crystal display associated with said transparent electrodes.

9. A complementary thin film semiconductor device according to claim 8, wherein said TFTs constitute a circuit for driving said liquid crystal display.

10. A complementary thin film semiconductor device according to claim 1, wherein said second pair of metal contacts are formed substantially of the same material as that of said first pair of metal contacts.

11. A complementary thin film semiconductor device according to claim 1, wherein said first and second pairs of metal contacts are metal silicide.

12. A complementary thin film semiconductor device according to claim 10, wherein said first and second pairs of metal contacts are metal silicide.

13. A complementary thin film semiconductor device comprising:
  an insulating underlie for supporting the semiconductor device ot be formed thereon;
  a pair of thin film semiconductor island regions supported on said insulating underlie, sapced from each other and having a high resistivity and a conductivity type of i- or n-type;
  a pair of heavily doped n-type regions formed on one of said island regions and spaced from each other by a predetermined distance, the heavily doped regions constituting a source and a drain region of an n-channel thin film transistor (n-TFT) and the predetermined distance defining a channel length of the n-TFT;
  a first pair of metal contacts formed on a surface of the other of said island regions and spaced from each other by another predetermined distance, the metal contact forming a high potential barrier when teh underlying semiconductor region is of n-type and a reduced potential barrier when the underlying region is of p-type, the pair of metal contacts constituting a source and a drain region of a p-channel thin film transistor (p-TFT) and said another predetermined distance defining a channel length of the p-TFT; and
  a pair of insulated gate structures formed on said pair of island regions, each at a position between the source and the drain of the asosciated TFT, wherein the insulated gate structure n-TFT is formed to overlap predetermined portions of said source region and said drain region of the n-TFT.

* * * * *